United States Patent
Knüttel

[11] Patent Number: 6,060,883
[45] Date of Patent: May 9, 2000

[54] RF COIL SYSTEM FOR AN MR MEASURING MEANS

[75] Inventor: Bertold Knüttel, Rheinstetten, Germany

[73] Assignee: Bruker Medizintechnik GmbH, Rheinstetten, Germany

[21] Appl. No.: 09/120,320

[22] Filed: Jul. 22, 1998

[30] Foreign Application Priority Data

Jul. 30, 1997 [DE] Germany .......................... 197 32 783

[51] Int. Cl.$^7$ .................................................. G01V 3/00
[52] U.S. Cl. ........................ 324/318; 324/309; 324/300; 324/307; 128/653.5; 335/299
[58] Field of Search .................... 324/318, 309, 324/307, 300; 128/653.5; 335/299

[56] References Cited

U.S. PATENT DOCUMENTS

| | | | |
|---|---|---|---|
| 4,939,464 | 7/1990 | Hammer | 324/318 |
| 4,939,465 | 7/1990 | Biehl | 324/318 |
| 5,168,211 | 12/1992 | Laukien et al. | 324/319 |
| 5,414,360 | 5/1995 | Westphal | 324/318 |
| 5,463,364 | 10/1995 | Müller | 335/299 |
| 5,545,997 | 8/1996 | Westphal | 324/320 |
| 5,696,449 | 12/1997 | Boskamp . | |

FOREIGN PATENT DOCUMENTS

| | | |
|---|---|---|
| 4104079 | 8/1992 | Germany . |
| 4408761 | 9/1994 | Germany . |
| 4438584 | 5/1995 | Germany . |
| 9100528 | 1/1991 | WIPO . |

OTHER PUBLICATIONS

S.C. Bushong: "Physical and Biological Principles" in Magnetic Resonance Imaging, Mosby, p. 152 (1996).

Primary Examiner—Christine K. Oda
Assistant Examiner—Brij B. Shrivastav
Attorney, Agent, or Firm—Paul Vincent

[57] ABSTRACT

An RF coil system (1) for an MR tomograph comprising a magnet coil system and a gradient coil system is characterized in that the RF coil system is constructed of two partial systems (2, 2') which are arranged essentially laterally reversed with respect to a plane z=0 containing the centre of the measuring volume and have a distance g/2 from the plane z=0, and that each partial system (2, 2') comprises at its axial end facing the plane z=0, a compensation section (3, 3') for homogenizing the RF field drop in the measuring volume caused by the axial gap between the partial systems (2, 2') as compared with an axially continuous and undivided RF coil system (1). The RF coil system (1) in accordance with the invention allows lateral access to the investigation volume in the radial direction and/or offers the possibility to integrate in the RF coil system an adjustment, fixing or support ring surrounding the investigation volume.

25 Claims, 7 Drawing Sheets

RF COIL SYSTEM FOR AN MR MEASURING MEANS

This application claims Paris Convention priority of German patent application number 197 32 783.4 filed Jul. 30, 1997, the complete disclosure of which is hereby incorporated by reference.

BACKGROUND OF THE INVENTION

The invention concerns a radio frequency (RF) coil system for a nuclear magnetic resonance (MR) measuring means, in particular an MR tomograph, which comprises a magnet coil system for the generation of a homogeneous magnetic field along a z-axis in a measuring volume within the MR measuring means and, if required, a gradient coil system for the generation of preferably linear magnetic field gradients in the measuring volume.

Such an RF coil system for an MR tomograph is e.g. known from U.S. Pat. No. 4,939,465.

Up to now, conventional RF coil systems of this kind have always been constructed in an axially continuous manner, such that lateral access to the investigation volume via the RF coil system was hardly possible. For this reason, it is e.g. extremely difficult with conventional RF coil systems to carry out minimum-invasive surgery, from the side, on a patient inside a tomograph, since there are always obstacles, like rods, bars and other coil parts of the RF coil system blocking the way. It would also be desirable to integrate in the RF coil system adjustment rings, fixing rings or support rings, which could support e.g. biopsy needles, laser means for coagulation, surgical instruments and the like or enable the exact determination of position or the positioning of the investigation object in the MR measuring means, such that the RF coil system, with its minimum radial distance from the z-axis, can get as close as possible to the surface of the measuring object.

For this reason, it is the object of the present invention to present an RF coil system of the initially described manner which allows lateral access, in the radial direction, to the investigation volume and/or provides the possibility to integrate into the RF coil system an adjustment ring, a fixing ring or a support ring surrounding the investigation volume.

SUMMARY OF THE INVENTION

This object is achieved in accordance with the invention in that the RF coil system is comprised of two partial systems which are arranged essentially laterally reversed with respect to a plane z=0 containing the centre of the measuring volume, and have each a distance g/2 from the plane z=0, and that each partial system comprises at its axial end facing the plane z=0, a compensation section for homogenizing the RF field drop in the measuring volume caused by the axial gap between the partial systems as compared with an axially continuous undivided RF coil system.

The RF coil which, according to the invention, is split into two partial systems with a final axial distance g from one another, permits unhindered radial lateral access from the outside to the investigation volume in the inside of the coil and also integration of component parts, in particular ring-like component parts within the gap of the RF coil system. The compensation section at the corresponding axial end of each partial system, facing the gap in each case, provides homogenizing of the deformation of the RF field in the investigation volume caused by the gap between the partial systems.

One embodiment of the inventive RF coil system is particularly preferred, wherein in the compensation section at least parts of the RF coil system have a greater radial distance from the z-axis than in the area outside of the compensation section. Theoretical calculations have shown that in this manner, particularly good homogenizing of the field effect generated by the gap can be achieved with simple means.

A further improvement of this embodiment which is particularly simple with respect to construction, comprises partial systems which are radially bent towards the outside in the area of the respective compensation section.

In a preferred further improvement, an alternative can be provided in that in the area of the respective compensation section, the partial systems open radially outwardly towards the plane z=0 in a steady, preferably conical manner. The construction of this sort of geometry is not much more complicated than that of radially outwardly bent compensation sections, however, it proves to be more advantageous with respect to the homogenizing of the RF field effect in the investigation volume due to the axial gap between the partial systems, which has to be achieved.

In embodiments of the RF coil system according to the invention, the partial systems may be in the form of birdcage resonators which are modified by the compensation section in each case. Such continuous birdcage resonators without gap are known per se e.g. from U.S. Pat. No. 4,939,4651.

As an alternative, in a further embodiment, the two partial systems together may form a coil system which is arranged around the z-axis in the shape of a saddle and extends symmetrically to the zy-plane, xy-plane and zx-plane of a Cartesian x-, y-, z-coordinate system. Saddle-shaped RF coil systems for MR measuring means are known per se from S. C. Bushony, Magnetic Resonance Imaging, Mosby, page 152, 1996, however, they do not have the axial gap as suggested in the present invention.

One embodiment of the inventive RF coil system is particularly preferred, wherein the two partial systems can be separated, which facilitates assembly on the one hand and, on the other hand, can be of advantage for the positioning of a measuring object.

In a further embodiment, the two partial systems are movable with respect to one another in an axial direction. In this manner, it is possible to find i.a. an optimum relative position of the two partial systems with respect to one another and also in relation to the surrounding parts of the MR measuring means by corresponding axial displacement of the two partial systems.

One embodiment is also advantageous, wherein the partial systems or at least one of the two partial systems can be unfolded. In this manner, it is easier to introduce e.g. the investigation object or a patient to be examined into the investigation volume. Furthermore, it is easy to replace adjusting rings, fixing rings or other ring-shaped supporting means for devices required during MR measurement, which are integrated in the RF coil system according to the invention at any time by other ones, if required.

A further improvement of the two latter embodiments of the invention provides one partial system being rigidly connected to the MR measuring means, while the other one is movable relative to the MR measuring means. This construction is particularly easy to realize since only one of the two partial systems has to be designed to be movable.

Alternatively, it is possible to design both partial systems to be movable with respect to the MR measuring means in order to provide more freedom for the assembly, adjustment and other handling of the RF coil system according to the invention.

Theoretical calculations have shown that it is advantageous, however not absolutely necessary, that in an RF coil system according to the invention, the proportion of the axial distance g of the two partial systems of the RF coil system from each other, to the respective axial length l of each of the two partial systems is $\frac{1}{4} \leq g/l \leq \frac{1}{2}$, preferably $g/l \approx \frac{1}{3}$.

It is likewise advantageous that the proportion of the minimum radial distance $r_{min}$ of the partial systems of the RF coil system from the z-axis to the maximum radial distance $r_{max}$ is $0.7 \leq r_{min}/r_{max} \leq 0.9$, preferably $r_{min}/r_{max} \approx 0.8$.

Furthermore, it has proven to be advantageous that the proportion of the axial length $l_1$ of a partial system of the RF coil system in the area outside of the compensation section to the axial length $l_2$ is $5 \leq l_1/l_2 \leq 10$, preferably $l_1/l_2 \approx 7$.

In a feasible embodiment of the RF coil system according to the invention, the two partial systems of the RF coil system are surrounded radially by a shielding, in each case. In this way, the resonator is defined in a mathematically precise manner and the exterior is practically free from RF fields.

In a particularly advantageous further improvement of this embodiment, the shieldings comprise at their ends facing the axial gap a compensation section, with a radial distance from the z-axis being at least in part larger than the respective shielding in the area outside of the compensation section. Through adaptation of the geometry of the shieldings to the geometry of the two partial systems of the RF coil system, the shielding effect can be optimized.

The proportion of the axial distance G of the two shieldings from one another to the respective axial length L of each of the two shieldings is preferably $\frac{1}{5} \leq G/L \leq \frac{1}{3}$, preferentially $G/L \approx \frac{1}{4}$.

Likewise, it is also preferred that the proportion of the minimum radial distance $R_{min}$ of a shielding from the z-axis to the maximum radial distance $R_{max}$ is $0.7 \leq R_{min}/R_{max} \leq 0.9$, preferably $R_{min}/R_{max} \approx 0.85$.

In case of a shielding with a compensation section, it was found out that the proportion of the axial length $L_1$ of the shielding in the area outside of the compensation section, to the axial length $L_2$ of the compensation section was favourably in the range of $7 \leq L_1/L_2 \leq 15$, preferably $L_1/L_2 \approx 11$.

For the proportion between the minimum radial distance $R_{min}$ of a shielding from the z-axis and the minimum radial distance $r_{min}$ of the shielded partial system of the inventive RF coil system from the z-axis, values in the range of $1.1 \leq R_{min}/r_{min} \leq 1.2$, preferably $R_{min}/r_{min} \approx 1.15$, should favourably be selected.

It would also be advantageous for the proportion of the axial length l of a partial system of the RF coil system to the axial length L of a shielding to be $0.5 \leq l/L \leq 0.9$, preferably $l/L \approx \frac{2}{3}$.

A particularly preferred embodiment of the inventive RF coil system is characterized in that in the axial gap between the two partial systems there is provided a support ring with one or more manipulators, e.g. a probe, a catheter, a biopsy needle, surgical instruments for minimum-invasive operations, a laser device for coagulating tissue etc., by means of which manipulations in the measuring volume can be controlled from the outside.

In a further improvement of this embodiment, the support ring comprises a means for fixing the measuring object to be investigated.

The support ring may comprise a means for adjusting one or more manipulators with respect to the measuring object.

The scope of the present invention covers also an RF coil system of the inventive type, wherein a detector ring for positron emission tomography (PET) is provided in the axial gap between the two partial systems. Means for combined MR and PET measurements are described e.g. in U.S. Pat. No. 4,939,464. However, in the known apparatus, the PET ring surrounds the RF coil which results in a bad filling factor of the PET unit on the one hand and on the other hand in impairment of the PET measurement through the RF resonator. The inventive RF coil system permits functional MRI measurement simultaneously with a PET measurement owing to the miniature PET detector ring mounted in the gap between the two partial systems of the RF coil system. In this way, it is possible to balance out the mutual disadvantages of the two competing complementary techniques, whereas their advantages take effect to their full extent.

One embodiment of the inventive RF coil system is of particular importance, wherein during operation, the magnet coil system and, if required, the gradient coil system provide an axial as well as a radial or inclined access to the measuring volume in an angular range about an axis perpendicular to the z-axis. In this way, in particular a free access to the investigation volume from the outside of the MR measuring means is maintained which permits e.g. minimum-invasive operations to be carried out simultaneously with MR tomography of a patient to be treated.

MR magnet systems, in particular for MR tomography, which permit sufficient lateral access to the investigation volume from the outside, are e.g. known per se from U.S. Pat. No. 5,168,211, U.S. Pat. No. 5,463,364 or U.S. Pat. No. 5,545,997. Gradient coil systems which also provide sufficient transverse access to the investigation volume, are known from U.S. Pat. No. 5,414,360.

Further advantages of the invention can be gathered from the description and the drawing. The features mentioned above and below can be utilized according to the invention individually or collectively in any arbitrary combination. The embodiments shown and described are not to be taken as exhaustive enumeration but rather have exemplary character for describing the invention.

The invention is shown in the drawing and is explained in detail by means of embodiments. In the drawing:

DESCRIPTION OF THE PREFERRED EMBODIMENT

Figure 1:
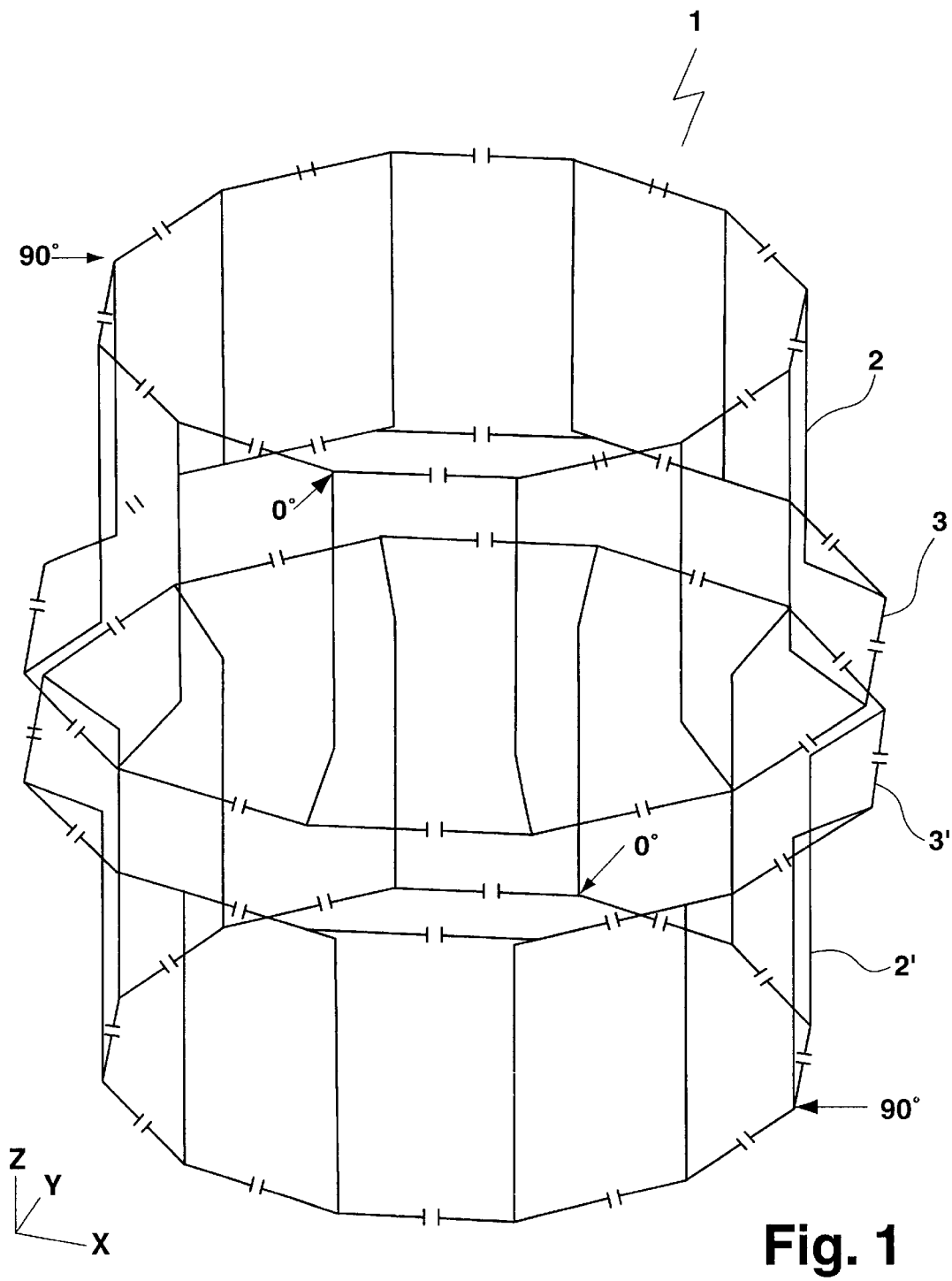
FIG. 1 shows a 3-dimensional view of an RF coil system in accordance with the invention embodied in the form of a birdcage resonator.

The radio frequency (RF) coil system 1 in FIG. 1 comprises two partial systems 2, 2' which are constructed in the manner of so-called birdcage resonators and are arranged essentially laterally reversed with respect to a plane z=0 containing the centre of a measuring volume. Each of the partial systems 2, 2' has an axial distance g/2 from the plane z=0. At its axial end facing the plane z=0, each of the partial systems 2, 2' comprises a compensation section 3 or 3', which serves for homogenizing the RF field drop in the measuring volume caused by the axial gap between the partial systems 2, 2' as compared with an axially continuous undivided RF coil system.

The split birdcage resonator system 1 shown in FIG. 1 indicates schematically the usual capacitors at the end rings of the birdcage, which, as an alternative or additionally, may be integrated also in the rods of the birdcage.

Figure 2:
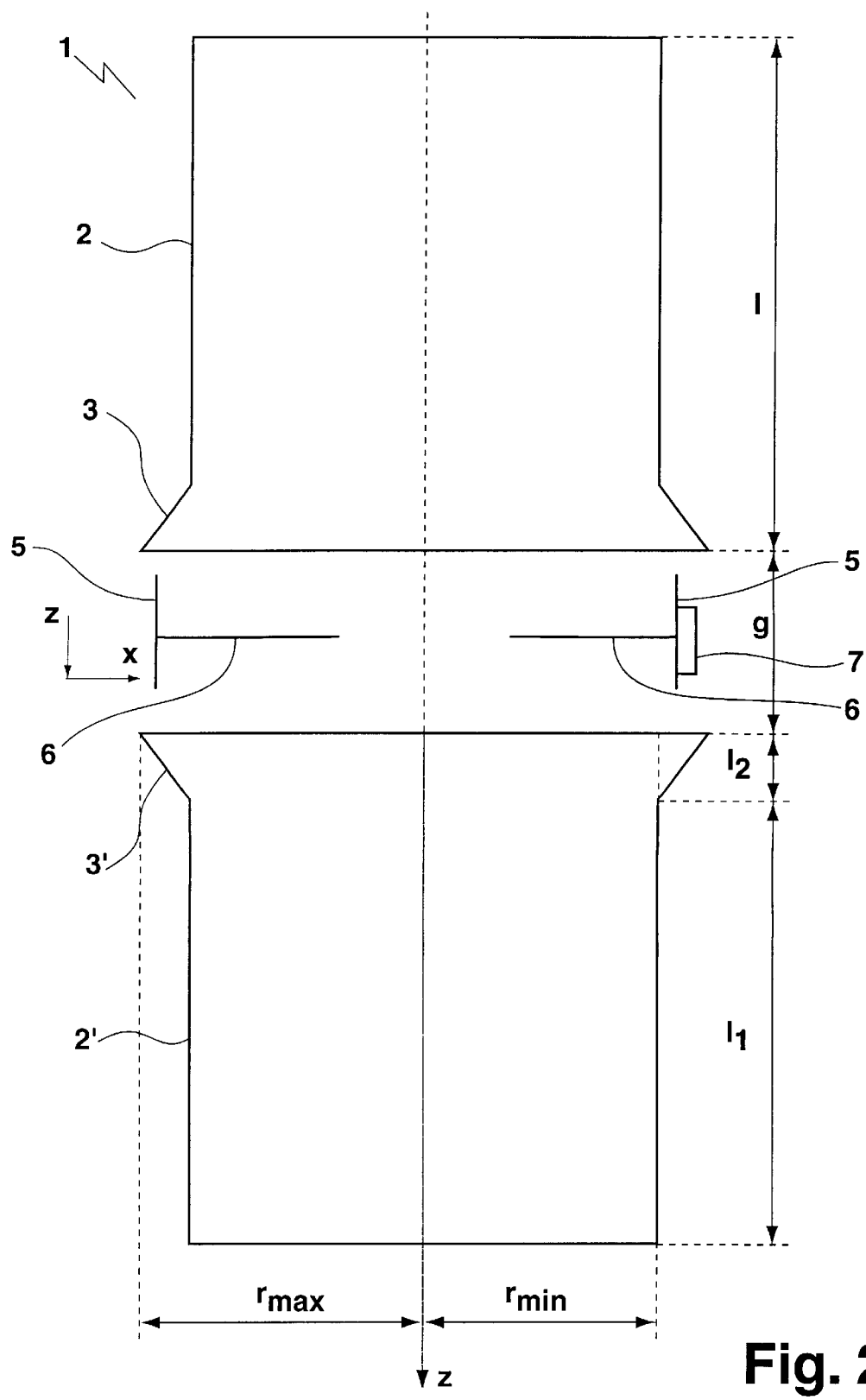
FIG. 2 shows the RF coil system according to FIG. 1 from the side, viewed in the direction of the zx-plane.

FIG. 2 shows the axially split "double birdcage arrangement" from FIG. 1 viewed from the side in the direction of the y-axis. One can see that the compensation sections 3, 3' comprise a greater radial distance from the z-axis than the other parts of the RF coil systems. In particular, the compensation sections 3, 3' shown in this embodiment are conical, and open radially outwardly towards the plane z=0 in a continuous manner. In embodiments not shown in the drawing, it is possible to design the compensation sections to simply bend radially outwardly.

In the shown embodiment of an RF coil system 1 in the form of a split birdcage resonator, the axial length l of each of the two partial systems 2, 2' is l=150 mm, wherein the axial length $l_1$ of a partial system 2, 2' in the area outside of the compensation section 3, 3' is $l_1$=130 mm and the axial length $l_2$ of the respective compensation section 3, 3' is $l_2$=20 mm. The axial distance g between the two partial systems 2, 2' is in this case g=55 mm. The minimum radial distance of a partial system 2, 2' from the z-axis is $r_{min}$=137 mm, the maximum radial distance $r_{max}$=167 mm.

A ring element 5 is disposed in the axial gap g between the two partial systems 2, 2' for supporting manipulators such as a probe, a catheter, a biopsy needle, surgical instruments, a laser device or a detector ring for positron emission tomography. Means 6 are also provided for fixing the measuring object as are means 7 for adjusting one or more of the manipulators relative to the object.

Figure 3:
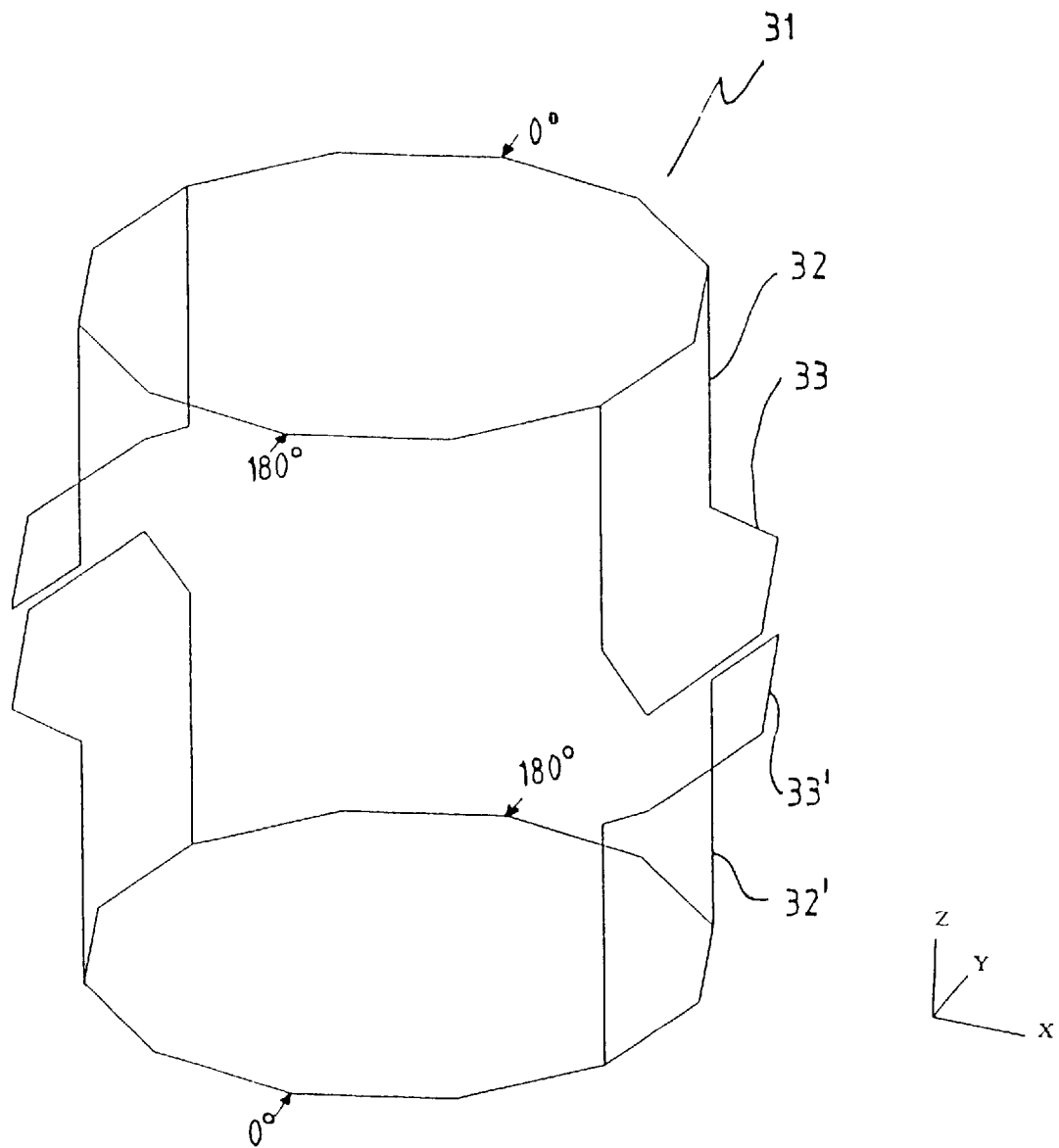
FIG. 3 shows a schematic 3-dimensional representation of an embodiment of the inventive RF coil system as saddle coils (linear resonator)

FIG. 3 shows schematically an embodiment of the inventive split RF coil system 31, wherein the two partial systems 32, 32' and their respective compensation sections 33, 33' are embodied as coils which extend in the form of a saddle about the z-axis and extend symmetrically to the zy plane, the xy plane and to the zx plane of a Cartesian x-, y-, z-coordinate system.

Figure 4:
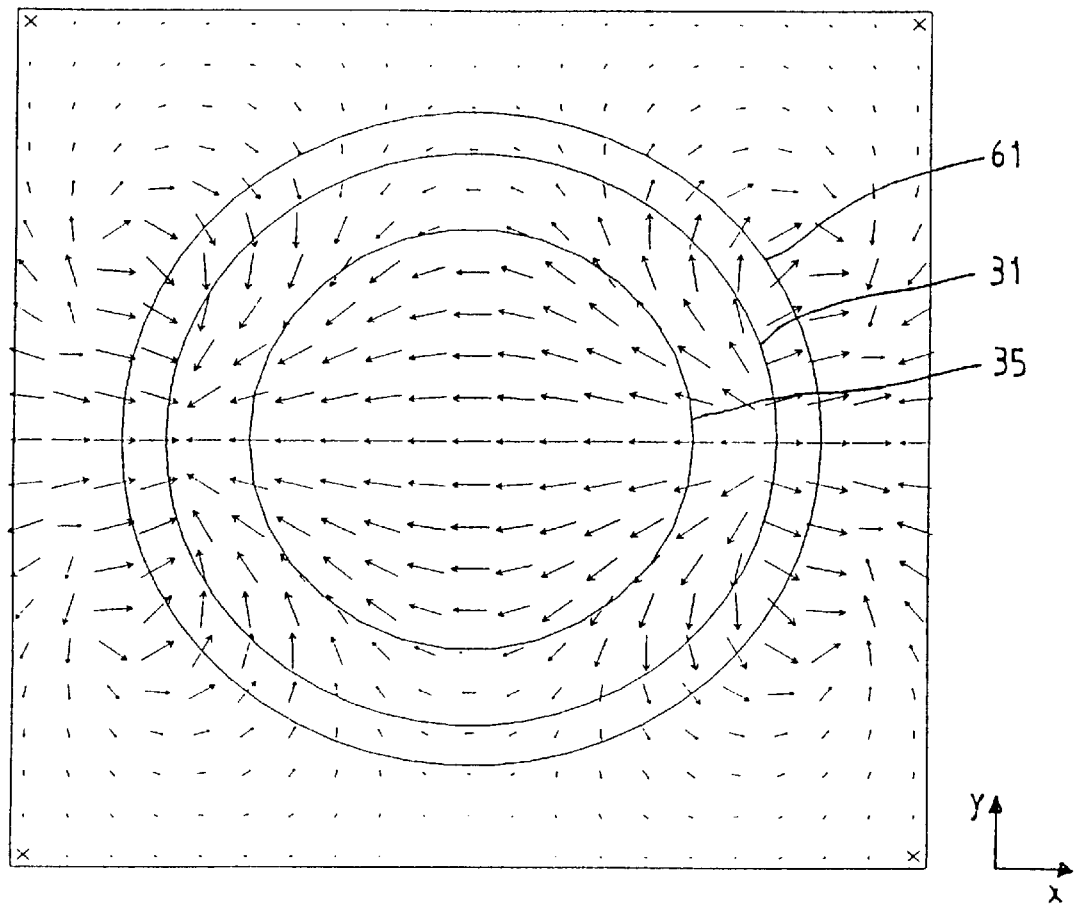
FIG. 4 shows a calculated representation of the H field vectors of the saddle coil arrangement of FIG. 3 in the plane z=0.

FIG. 4 shows a sectional view of the xy plane (z=0) of the magnetic flux distribution in the plane of the gap of the RF field generated by the split saddle coil system 31 shown in FIG. 3 at a frequency of approximately 23 MHz. In the area of an investigation volume 35, the homogeneity of the generated RF field is relatively high. The radial extent of the RF coil system 31 in the area of $r_{min}$ and also a shielding 61 surrounding the same are also schematically shown in order to clarify the relative proportions although the plane z=0 contains exactly the gap between the two partial systems 32, 32' and 62, 62', respectively.

Figure 5:
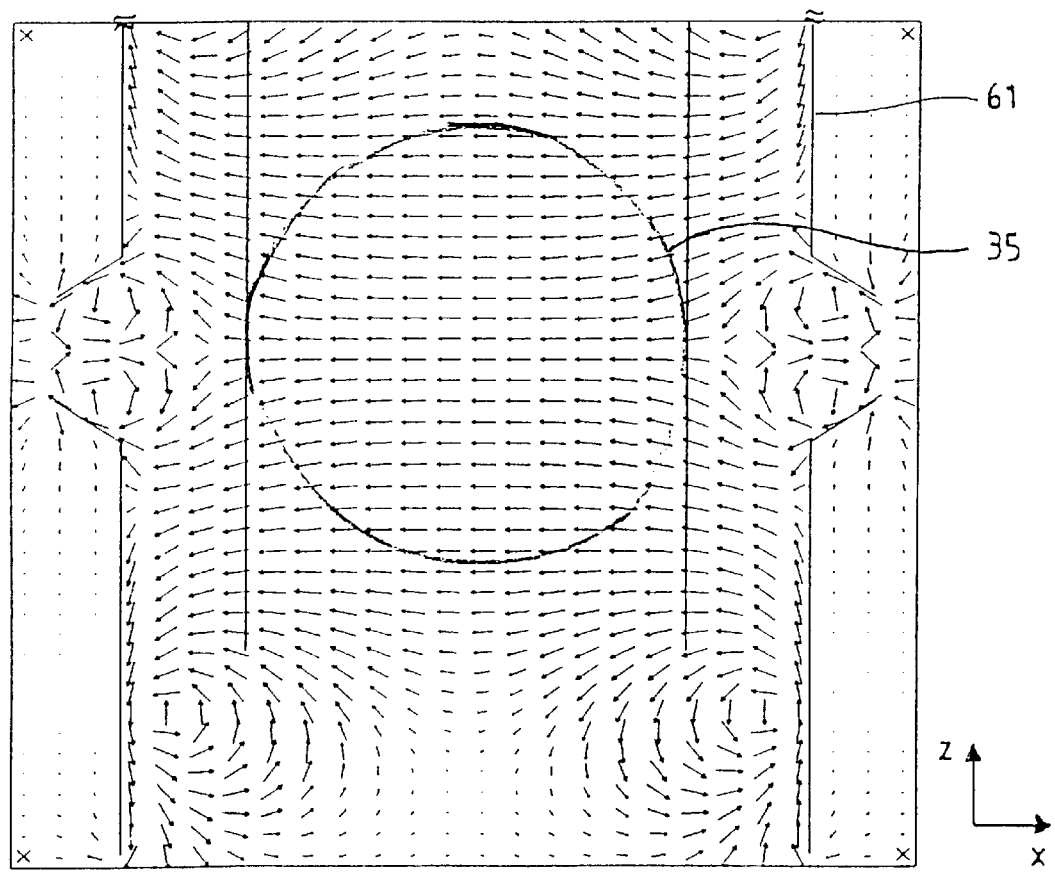
FIG. 5 a calculated representation of the H field distribution in the plane y=0.

FIG. 5 shows the distribution of the RF field vectors in the zx plane (y=0) of the RF coil system 31 shown in FIG. 3, which again has a high homogeneity in the area inside the investigation volume 35. Furthermore, one realizes that in the area outside of a shielding 61 only minor parts of the generated RF field escape radially to the outside.

Figure 6:
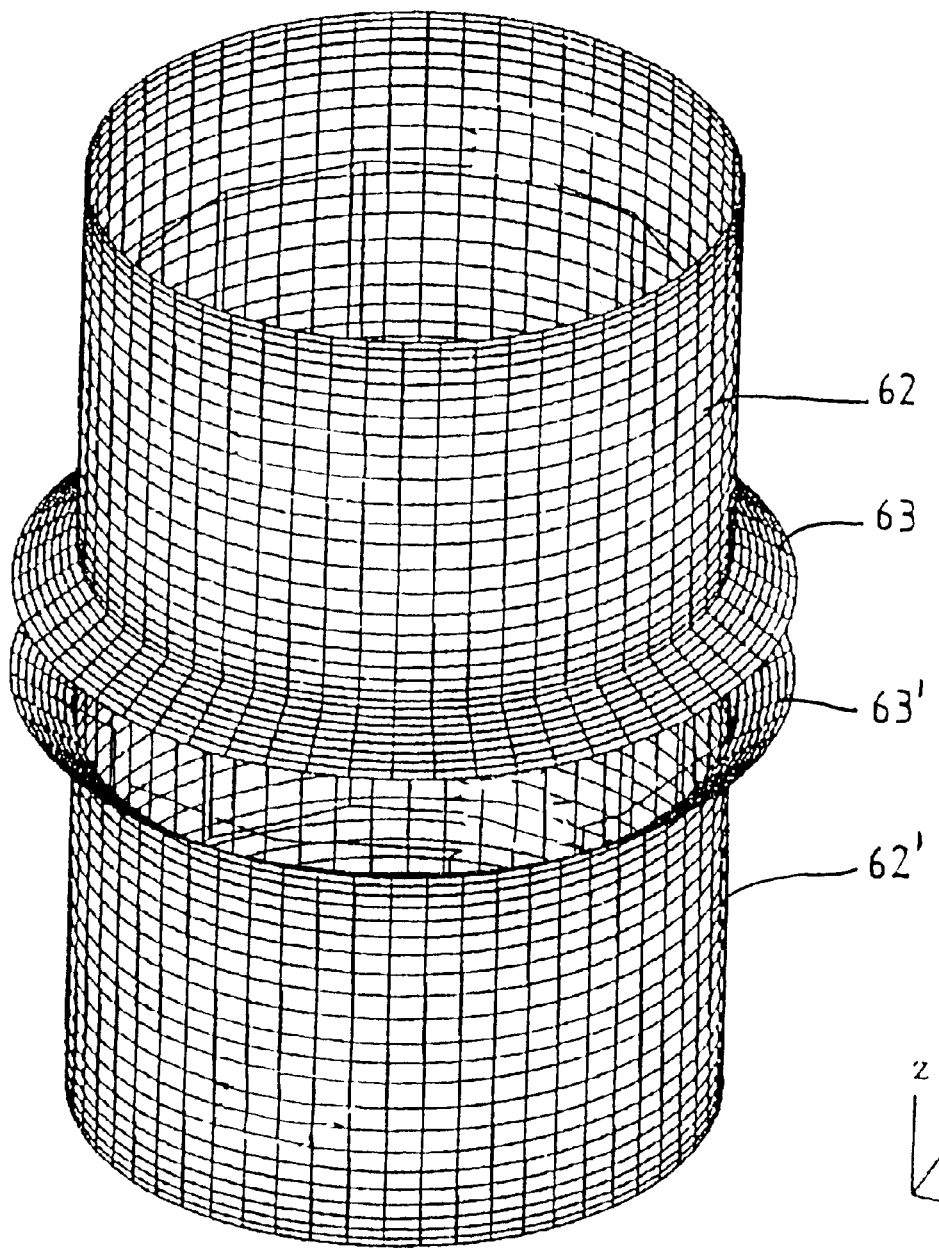
FIG. 6 a 3-dimensional representation of a shielding arrangement for the inventive RF coil system.

As mentioned before, the RF coil systems 1, 31 in accordance with the invention may be surrounded radially by shielding means. FIG. 6 shows a system of two corresponding shieldings 62, 62' of this type, wherein each of their ends facing the axial gap comprise a compensation section 63 and 63', respectively, which has a greater radial distance from the z-axis than the other parts of the shielding 62, 62'.

Figure 7:
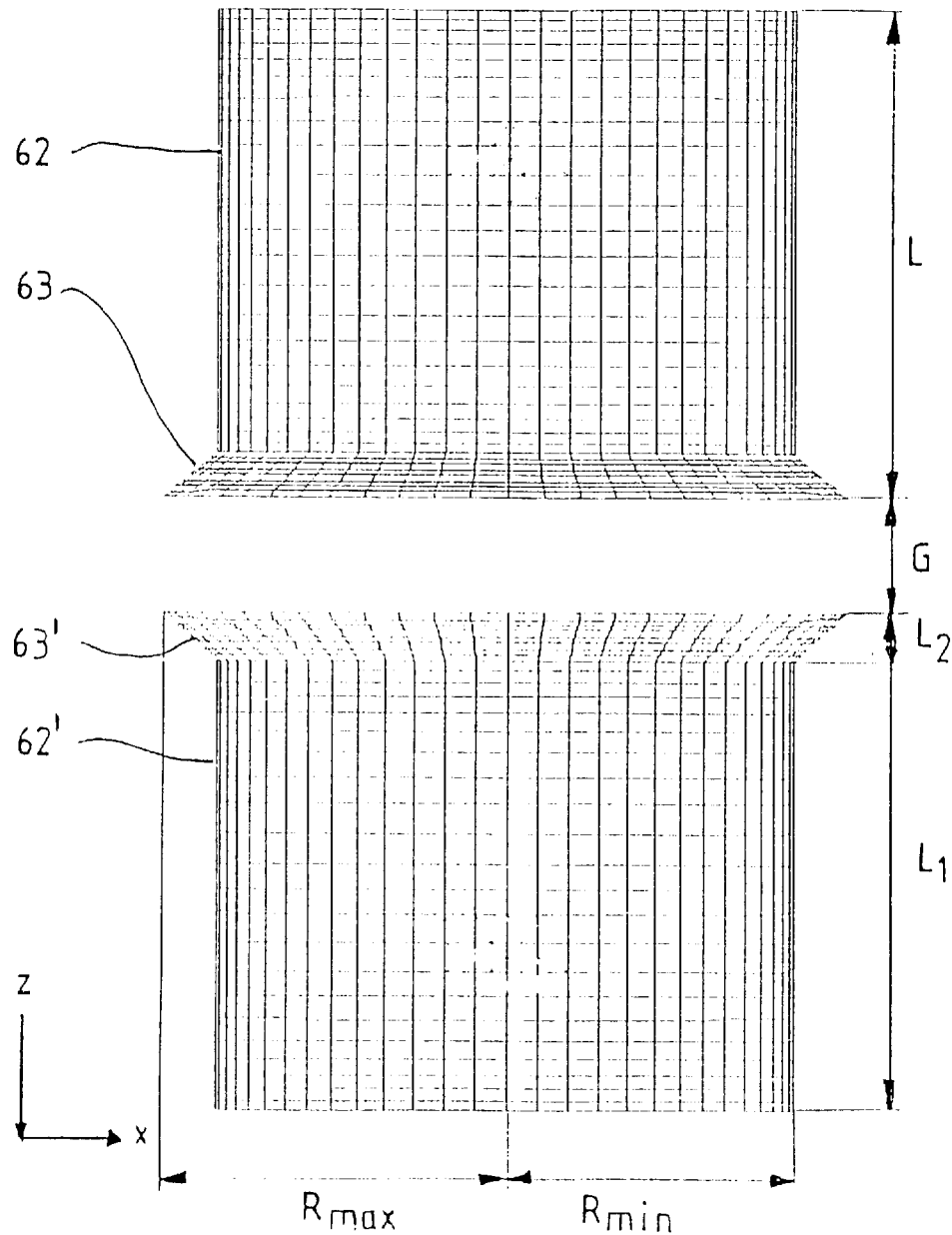
FIG. 7 a lateral view of the shielding arrangement according to FIG. 6 in the plane y=0.

FIG. 7 finally shows a side view onto the shieldings 62, 62' of FIG. 6, viewed in the direction of the zx plane. The axial length L of the two shieldings 62, 62' in the embodiment shown is L=220 mm in each case, wherein the axial extent $L_2$ of the compensation section 63, 63' is $L_2$=20 mm, whereas the axial length $L_1$ of the remaining shielding is $L_1$=200 mm. The minimum radial distance $R_{min}$ of the shieldings 63, 63' from the z-axis is $R_{min}$=157 mm in the embodiment shown, the maximum radial distance $R_{max}$ in the area of the compensation sections 63, 63' is $R_{max}$=187 mm, in each case. The axial distance G between the two shieldings 62, 62' finally is G=50 mm.

Concerning the RF coil systems 1, 31, according to the invention, it can be said in general that the respective partial systems 2, 2' and 32, 32', respectively, can be separated. In particular, they are movable with respect to one another in the axial direction and/or can be unfolded. Thereby both partial systems 2, 2' and 32, 32', respectively, may be designed in such a manner, that they are movable with respect to a surrounding MR measuring means. As an alternative, one of the two partial systems may be rigidly connected to the MR measuring means, whereas the other one is movable with respect thereto.

In a quadrature version of the RF coil system 31 according to the invention, which is not shown in the drawing, a further identical saddle coil system rotated by 90° about the z-axis is added to the two partial systems 32, 32', in each case, which permits excitation and reception, respectively, of RF pulses of the linearly independent x and y components, as known per se from prior art.

In the following, we will discuss possible current flow through an RF coil system in accordance with the invention taking the partial coil 32 of FIG. 3 as an example: The two saddles on the left-hand and right-hand side in the drawing are electrically connected in parallel. The current is fed at the front feeding point (RF phase=0°), is then divided to the right-hand and to the left-hand side, circulates through the saddles in one or more windings in each case, and is returned via the rear feeding point (RF phase=180°). The upper partial system 32 is connected to the partial system 32', which is laterally reversed with respect to the xy plane, either in parallel or in series. The use of a quadrature coil system doubles the entire arrangement as compared with FIG. 3, wherein the newly added saddle coils are rotated by 90° about the z-axis and the fed RF phase is also shifted by 90°. In the area of the saddles, the current circulates through one or more loops in each case. The capacitors may be arranged anywhere in the RF oscillating circuit, including e.g. the area of the saddles.

It is particularly preferred to use the inventive RF coil system 1 and 31, respectively, in MR tomographs, the magnet coil system and gradient coil system of which are designed in such a manner that they leave open not only an axial access in the direction of the z-axis, but also a radial access to the measuring volume in a considerable angular range about an axis perpendicular to the z-axis. In this way, e.g. a surgeon is able to establish physical contact with a patient via the gap between the two partial systems 2, 2' and 32, 32', respectively, in order to carry out examinations and/or minimum-invasive operations.

The RF coil system 1, 31 in accordance with the invention may also be used in conventional MR tomographs which do not offer any radial access to the investigation volume, which, however, are large enough, to leave a radial distance from the areas of the RF coil system which are located radially outwardly such that radial access to the investigation volume through the split RF coil system inside the MR tomograph is established again.

For example, the axial gap between the two partial systems 2, 2'; 32, 32' can accommodate a support ring (not shown in the drawing) which may contain manipulators, like probes, catheters, biopsy needles or surgical instruments for minimum-invasive operations, laser devices and the like. In this way, it is possible to control manipulations in the investigation volume from outside of the tomograph.

One embodiment of the inventive RF coil system is particularly preferred, wherein in the axial gap between the two partial systems 2, 2' and 32, 32', respectively, a detector ring is provided for positron emission tomography (PET). The latter, however, has to be correspondingly miniaturized as compared with conventional PET detector rings. In this way, it is possible to combine the high sensitivity of PET measurements and the high resolution and the limited technical effort of MR measurements.

I claim:

1. A radio frequency (RF) coil system for a nuclear magnetic resonance (MR) measuring means, preferably an MR tomograph, the measuring means comprising a magnet coil system for generating a homogeneous magnetic field along a z-axis of an x, y, z Cartesian coordinate system in a measuring volume within the MR measuring means, the RF coil system comprising:

a first partial system disposed at a lateral separation g/2 from a z=0 plane containing a center of the measuring volume, said first partial system having a first compensation section at an end facing said z=0 plane; and a second partial system disposed substantially mirror symmetrically across said z=0 plane from said first partial system at said separation g/2 from said z=0 plane, said second partial system having a second compensation section at an end facing said z=0 plane, wherein said first and said second compensation sections compensate for an RF field drop in an axial gap between said first and said second partial systems.

2. The RF coil system of claim 1, wherein parts of said first and said second compensation sections have a greater radial separation from the z-axis than an area of said first and said second partial systems axially outside of said first and said second compensation sections.

3. The RF coil system of claim 2, wherein said first and said second compensation sections are curved radially outward.

4. The RF coil system of claim 2, wherein said first and said second compensation sections open radially outwardly in a continuous manner towards the z=0 plane.

5. The RF coil system of claim 1, wherein said first and said second partial systems are birdcage resonators modified by said first and said second compensation sections.

6. The RF coil system of claim 1, wherein said first and said second partial systems form an RF coil system disposed in a saddle-shaped manner about the z-axis and extending symmetrically with respect to a zy-plane, an xy-plane, and a zx-plane.

7. The RF coil system of claim 1, wherein said first and said second partial systems are adapted for mutual separation.

8. The RF coil system of claim 1, wherein said first and said second partial systems are adapted for displacement with respect to each other in an axial direction.

9. The RF coil system of claim 1, wherein said first and said second partial systems are adapted for unfolding.

10. The RF coil system of claim 8, wherein said first partial system is rigidly connected to the MR measuring means and said second partial system is displaceable with respect to the MR measuring means.

11. The RF coil system of claim 8, wherein said first and said second partial systems are displaceable with respect to the MR measuring means.

12. The RF coil system of claim 1, wherein one of said first and said second partial systems has an axial length l with $1/4 \leq g/l \leq 1/2$.

13. The RF coil system of claim 1, wherein said first and said second partial systems have a minimum radial separation $r_{min}$ and said first and said second compensation sections have a maximum radial separation $r_{max}$ from the z-axis, with $0.7 \leq r_{min}/r_{max} \leq 0.9$.

14. The RF coil system of claim 1, wherein one of said first and said second partial systems has an axial length l and one of said first and said second compensation sections has an axial length $l_2$, with $5 \leq l_1/(l-l_1) \leq 10$.

15. The RF coil system of claim 1, further comprising a first shield radially surrounding said first partial system and a second shield radially surrounding said second partial system.

16. The RF coil system of claim 15, wherein said first shield has a first shield compensation section at an end facing said axial gap and said second shield has a second shield compensation section at an end facing said axial gap, said first and said second shield compensation sections having a larger radial separation from the z-axis than said first and second shields in an area axially outside of said first and second shield compensation sections.

17. The RF coil system of claim 15, wherein said first and said second shield have an axial separation G and an axial length L, with $1/5 \leq G/L \leq 1/3$.

18. The RF coil system of claim 15, wherein one of said first and said second shields has a minimum radial separation $R_{min}$ from the z-axis and one of said first and said second shield compensation sections has a maximum radial distance $R_{max}$ from the z-axis, with $0.7 \leq R_{min}/R_{max} \leq 0.9$.

19. The RF coil system of claim 16, wherein one of said first and said second shields has an axial length L and one of said first and said second shield compensation sections has an axial length $L_2$, with $7 \leq (L-L_2)/L_2 \leq 15$.

20. The RF coil system of claim 15, wherein one of said first and said second shield has a minimum radial separation $R_{min}$ from the x-axis and one of said first and said second partial systems has a minimum radial distance $r_{min}$ from the z-axis, with $1.1 \leq R_{min}/r_{min} \leq 1.2$.

21. The RF coil system of claim 15, wherein one of said first and said second shield has an axial length L and one of said first and said second partial systems has an axial length l, with $0.5 \leq l/L \leq 0.9$.

22. The RF coil system of claim 1, further comprising a support ring for supporting a manipulator in said axial gap to externally control manipulations in the measuring volume.

23. The RF coil system of claim 22, wherein said support ring comprises means for fixing a measuring object being investigated.

24. The RF coil system of claim 22, wherein said support ring comprises means for adjusting said manipulator with respect to a measuring object.

25. The RF coil system of claim 1, further comprising a detector ring for positron emission tomography (PET) disposed within said axial gap.

* * * * *